United States Patent [19]
Liu et al.

[11] Patent Number: 5,585,792
[45] Date of Patent: Dec. 17, 1996

[54] ENEGRY-SAVING KEYBOARD

[75] Inventors: Jun Liu, Weehawken, N.J.; Ioannis Milios, New York, N.Y.

[73] Assignee: USAR Systems Inc., New York, N.Y.

[21] Appl. No.: 328,077

[22] Filed: Oct. 24, 1994

[51] Int. Cl.$^6$ ................................................. H03K 17/94
[52] U.S. Cl. ............................ 341/22; 341/26; 395/750; 364/707
[58] Field of Search ................................ 364/200, 707; 341/26, 22; 395/275, 750, 868, 878, 887

[56] References Cited

U.S. PATENT DOCUMENTS

| | | | |
|---|---|---|---|
| 4,649,373 | 3/1987 | Bland et al. | |
| 4,980,836 | 12/1990 | Carter et al. | 364/200 |
| 4,995,110 | 2/1991 | McGarry | 379/155 |
| 5,083,266 | 1/1992 | Watanabe | 395/275 |
| 5,201,059 | 4/1993 | Nguyen | 395/800 |
| 5,237,692 | 8/1993 | Raasch et al. | 395/725 |
| 5,280,283 | 1/1994 | Raasch et al. | 341/26 |
| 5,283,906 | 2/1994 | Chen | 395/750 |
| 5,384,721 | 1/1995 | Joto | 364/707 |

Primary Examiner—Jeffery Hofsass
Assistant Examiner—Timothy Edwards, Jr.
Attorney, Agent, or Firm—Oppedahl & Larson

[57] ABSTRACT

An improved energy-saving keyboard with low parts count accomplishes a sophisticated regime of low-power mode intervals in response to key closures and communications from the computer to which the keyboard is connected. An interrupt pin of the keyboard controller (encoder) prompts the transition from low-power mode to normal mode. The communications from the computer is synchronous communications mediated by a clock line, and the interrupt pin is tied not to the clock line but to the data line of the synchronous channel. The interrupt pin is also tied to a resistor array providing pullup biases to the keyboard matrix; in normal-power mode a discrete output of the encoder forces the common point of the resistor array to a fixed voltage level. In low-power mode, on the other hand, the discrete output is not asserted, and the resistor array is pulled high by a pullup impedance of relatively high resistance to the fixed voltage level. In this way, any key closure at the keyboard triggers the interrupt. LEDs, if lit, are gradually dimmed in the absence of key activity, to conserve electrical power.

39 Claims, 4 Drawing Sheets

ENEGRY-SAVING KEYBOARD

BACKGROUND OF THE INVENTION

The invention relates generally to power conservation in electronic devices, and relates particularly to power conservation in a keyboard encoder.

Extraordinary amounts of attention have been paid to the goal of reducing power consumption in consumer devices including personal computers. There are two general motivations for this. First, it is considered important in today's society to reduce the consumption of fossil fuels, and reducing power consumption in personal computers furthers that goal. Second, the present consumer marketplace rewards those who find ways to make computers small and light in weight, and who find ways to make it possible for the computers to run for a long time without the requirement of connection to household electrical current.

The general categories of techniques used for reducing power consumption in personal computers are by now very well known to even the most casual user of a laptop, notebook, or sub-notebook personal computer. One category is to reduce the power consumption of the various high-power-demand building blocks, such as the hard disk drive, the floppy disk drive, static memory, the display, and the central processing unit. Another category is to switch the high-power-demand building blocks on and off at particular times. Another quite distinct category is to provide high-power and low-power modes in those building blocks, and to switch them between modes at particular times. If the decision is made to design a computer so that its subsystems will switch between operational modes from time to time, then a subcategory of the design process is to specify what the determining factors will be (e.g. how long since the last user keystroke, or how long since the last disk access) and what action will be taken (e.g. power down the hard disk thirty seconds after the last disk access).

In the process of squeezing every wasted milliwatt out of the computer system, there comes a time when all the parts of the system other than the keyboard have been squeezed as much as possible and the only part remaining is the keyboard.

One of the highly standardized interfaces in modern personal computers is the interface between the keyboard and the computer (here often called "the system"). The interface is defined on several hardware and software levels. The hardware-level interface definition includes a wire count (power, clock, data, and ground) and signal levels for those wires. Protocols are well recognized for synchronous (clock-mediated) serial transmission bidirectionally between the keyboard and the computer. According to the PS/2 protocol, for example, any communication from the computer ("the system") to the keyboard is annunciated first by asserting (in this context, dropping the voltage level of) the clock line, followed by lowering the data line in order to assert the first bit which is always zero. The keyboard, following the protocol, prepares to receive a byte from the computer. The byte is communicated to the keyboard as serial data clocked by transitions on the clock line, the clock transitions provided by the keyboard.

As is well known to those familiar with keyboards of personal computers, the majority of communications between the computer and the keyboard is in the direction from the keyboard to the computer. Such communication most often the result of a user typing on the keyboard, and is carried on the clock and data lines just discussed. Other communications from the keyboard to the computer are the result of responding to commands from the computer. Still other communications from the keyboard to the computer are part of the power-on initialization and diagnosis sequence.

Communications from the computer to the keyboard are relatively infrequent and are used to communicate, for example, that the status LEDs (shift lock, scroll lock, and nums lock) should be turned on or off.

One of the decisions in the design of a keyboard is the selection of the entity that will mediate between the keys and the computer ("the system"). Historically a common choice is to use two microcontrollers for this purpose. By "microcontroller" is meant an integrated circuit containing a microprocessor, RAM, ROM, and I/O circuitry. One microcontroller is located within the keyboard and the other is located within the computer, and the two microcontrollers are linked with a serial bus. As a matter of convention, the microcontroller that is in the computer is called a "controller" and the microcontroller that is in the keyboard is called an "encoder". In more recent years the functionality of the controller in the computer has been absorbed into an application-specific integrated circuit (ASIC) that serves many functions in addition to mediating between the keyboard serial bus and the rest of the computer.

Within the keyboard, the keys are disposed in a matrix with rows and columns. The encoder monitors the rows and columns to detect key closures and releases. Among the non-trivial design demands are that the encoder perform switch contact debouncing and resolve n-key rollover conditions and "phantom" keys resulting from instances when more than one key has been pressed. The encoder must interpret each event, such as a key closure or release, into a standardized datum called a scancode for transmission to the computer. The typical encoder employed is an eight-bit microcontroller with RAM, ROM, I/O ports to receive all the matrix lines, and serial lines serving the communications channel to the computer. The encoder microcontroller is often selected from or compatible with the Intel 8042 or 8031 microcontroller families, and is often chosen to be CMOS for lower power consumption. Within the computer the controller is often an 8042 microcontroller or an equivalent functionality within an ASIC.

The effort to reduce power consumption in the keyboard thus focuses on the encoder. As is well known to those skilled in the art, the power consumption in CMOS microcontrollers devices bears a strong linear relation to the clock speed at which the microcontroller is being operated (which, it will be appreciated, has little or no relation to the clock rate of the synchronous serial channel between the keyboard and the computer). Thus, one strategy for reducing power consumption in the keyboard encoder is to reduce its clock speed. Those skilled in the art will appreciate, however, that there are tradeoffs in this approach. Slowing down the clock speed of the encoder means that the encoder cannot provide so many services in a given period of time. This sets a natural lower limit on how much the clock speed of the encoder can be reduced.

It is also known in the art, as a general approach, to have the keyboard encoder enter a state in which it consumes very low power, at times when there is no need for the encoder to be functioning. For example the encoder is generally required to respond to only two stimuli—the pressing of a key or the attempt by the computer to send a message to the keyboard. Thus, in prior art encoders, an energy-saving approach is for the encoder to keep track of how long it has been since a key has been pressed, and to keep track of how long it has been since a message has been received from the computer. If some predetermined period of time passes, then the encoder can enter its very-low-power state. This is typically a "halt" state which results in virtually no activity in the encoder, and virtually no power consumption. The design of the encoder is such that there is an interrupt pin, assertion of which causes the encoder to "wake" up and to begin execution of an interrupt service routine. But it typically requires a large parts count for all the events that would trigger waking up to be able to do so.

It should also be appreciated, however, that there are many potential difficulties in switching between the normal and very-low-power (also called "sleep") states. The most critical task is not to determine when to go to sleep, although many prior art designs devote much attention to the timing of when to go to sleep. The most critical task is how to leave the "sleep" state, that is, how to "wake up". This is because when the microcontroller "sleeps", its functionality is usually limited and requires some certain amount of time, often termed a "latency period", to wake up. In order not to miss any real-time events, such as keystrokes and commands from the system, special precautions are needed. Implementing the "wake up" feature is a very complicated job.

It is desirable to have a keyboard in which a relatively small parts count suffices to permit wakeup events to trigger waking up. It is also desirable to avoid or minimize nuisance wakeups: wakeups that occur even though it was not really necessary to wake up.

SUMMARY OF THE INVENTION

An improved energy-saving keyboard with low parts count accomplishes a sophisticated regime of low-power mode intervals in response to key closures and communications from the computer to which the keyboard is connected. An interrupt pin of the keyboard encoder prompts the transition from low-power mode to normal mode. The communications from the computer is synchronous communications mediated by a clock line, and the interrupt pin is tied not to the clock line but to the data line of the synchronous channel. The interrupt pin is also tied to a resistor array providing pullup biases to the keyboard matrix; in normal-power mode a discrete output of the encoder forces the common point of the resistor array to a fixed voltage level. In low-power mode, on the other hand, the discrete output is not asserted, and the resistor array is pulled high by a pullup impedance of relatively high resistance to the fixed voltage level. In this way, any key closure at the keyboard triggers the interrupt.

DESCRIPTION OF THE DRAWING

The invention will be described with respect to a drawing in several figures, of which.

DETAILED DESCRIPTION

Figure 1:
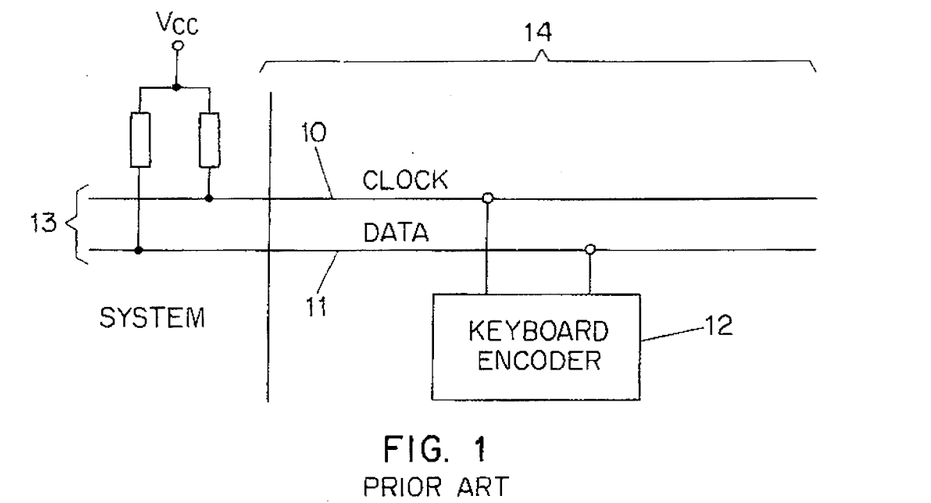
FIG. 1 shows a typical prior art connection arrangement between the encoder of a keyboard and the main computer system.

To appreciate the invention it is helpful to consider the prior art. FIG. 1 shows a typical prior art connection arrangement between the encoder of a keyboard and the main computer system. The computer system is connected at 13, and the keyboard is at 14 generally. The keyboard has a matrix of keys, omitted for clarity in FIG. 1, connected by row and column lines to the microcontroller 12, also called a keyboard encoder. Bidirectional communications are effected between the encoder 12 and the computer system 13 over a serial synchronous communications bus comprising lines 10 (clock) and 11 (data). Omitted for clarity in FIG. 1 are additional lines in the cable connecting the keyboard to the personal computer, namely +5V and ground.

As is well known in the personal computer art, personal computers running MS-DOS (e.g. IBM PS/2 computers) follow a protocol between the computer and the keyboard. According to the protocol, the clock and data lines are set up so that either the computer or the keyboard can pull the line low. When no communications is taking place, both the clock line and the data line are pulled high by pullup resistors.

Most of the communications between the computer and the keyboard is in the direction from the keyboard to the computer, responsive to the user pressing keys on the keyboard. When the keyboard sends data to the computer, it generates the clock signal to time the data. The computer system responds to the assertion (pulling low) of the clock line by clocking the data from the keyboard into appropriate hardware such as a shift register, microcontroller, or application-specific integrated circuit.

From time to time, however, the computer chooses to send information to the keyboard. It does so by pulling down the clock line. According to the protocol, the significance of the clock line being pulled down is that the keyboard is forbidden to send data; instead, the keyboard will prepare itself for the possibility of receiving data from the computer. For someone designing an encoder the usual design step is to treat the clock line being pulled down as an interrupt or polled signal that lets the microcontroller know that (1) it is going to have to wait instead of sending any data it may wish to send and (2) it is going to have to prepare itself for receiving data from the computer.

It will be appreciated that there is the possibility of a collision if the computer and keyboard each happen to try to send data to the other during overlapping time frames. The protocol is set up so that in the event of a collision, which in this context is defined by the clock line being low at a time during the sending of data to the computer, when the keyboard intended the clock line to be high, then the keyboard stops sending and assumes that its data was not received by the computer. The keyboard resends the data at a later time, except if the keyboard has already sent ten bits (out of a possible eleven bits).

From the foregoing discussion it will be clear that the clock line is a very important input to the keyboard encoder. One use of the clock line is that the computer may pull down the clock line from time to time simply to suppress data from the keyboard during times when the computer is busy and unable to accept the keyboard data. An example of inhibiting the keyboard is the network environment.

Figure 2:
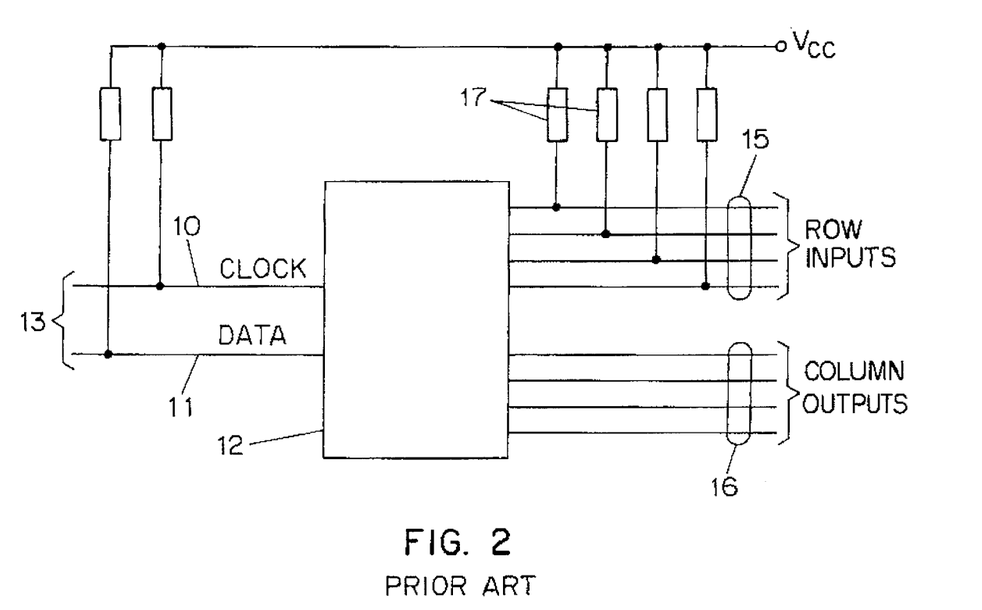
FIG. 2 shows the prior art configuration of FIG. 1, together with pullup resistors for the row inputs of a key scanning matrix.

Turning now to FIG. 2, there is shown the prior art configuration of FIG. 1, together with pullup resistors for the row inputs of a key scanning matrix. Each key of the keyboard is electrically positioned at an intersection of one of the rows 15 and columns 16. (The number of rows and columns is much more than shown in FIG. 2, and only four of each are shown for clarity.) Key closures and releases are detected by selectively grounding the column outputs, and polling the row inputs to see which, if any, have been pulled low due to a key closure.

Those skilled in the art will appreciate that the designations for "row" and "column" are quite arbitrary in the context of key matrix scanning. One could put pullup resistors on the columns, and selectively pull low the rows, polling for changes in the input voltages sensed at the columns, for example, which would be the inverse of what is shown in FIG. 2. As will be seen, the invention does not rely on one or the other of the arbitrary designations of "row" and "column".

Having described typical prior art keyboard circuitry, it is instructive to consider the usual ways that one might try to make a "green" keyboard, namely a keyboard that minimizes its use of electricity. Generally one wishes to have the processor go to "sleep", in some very low power state that is nonetheless capable of being "awakened" due to an interrupt. The interrupts to which one wishes the encoder to be able to respond include such unsurprising events as the press of a key or the arrival of signals indicative of the computer trying to send data to the keyboard.

It should be emphasized that data and/or commands from the system to the keyboard are not sent frequently. Nevertheless proper and timely response from the encoder is critical in order to maintain communication with the system. If the encoder were to fail to respond properly the system may hang up or drop altogether the communication with the keyboard. This is perhaps the most difficult part of the implementation of a sleep/wake mode in the keyboard, since the keyboard designer cannot afford to miss any data or commands from the system.

The usual design approach is to add components to the system of FIG. 2, so that (1) signals on the row inputs of the key matrix will somehow generate an interrupt to the encoder 12 and (2) if the communications bus 10, 11 becomes active this will generate an interrupt to the encoder 12. For example, a multiple-input XOR gate (which acts essentially as a parity checker) could have as its inputs the row inputs 15 and the communications lines 10 and 11. Any change in the output of the XOR gate would interrupt the processor which would then quickly respond to the event causing it to awaken.

Such an approach has the drawback that such an XOR gate takes up space, costs money, adds to board complexity, and itself draws electrical power. What's more, as will be discussed below, such an approach has other drawbacks.

Figure 3:
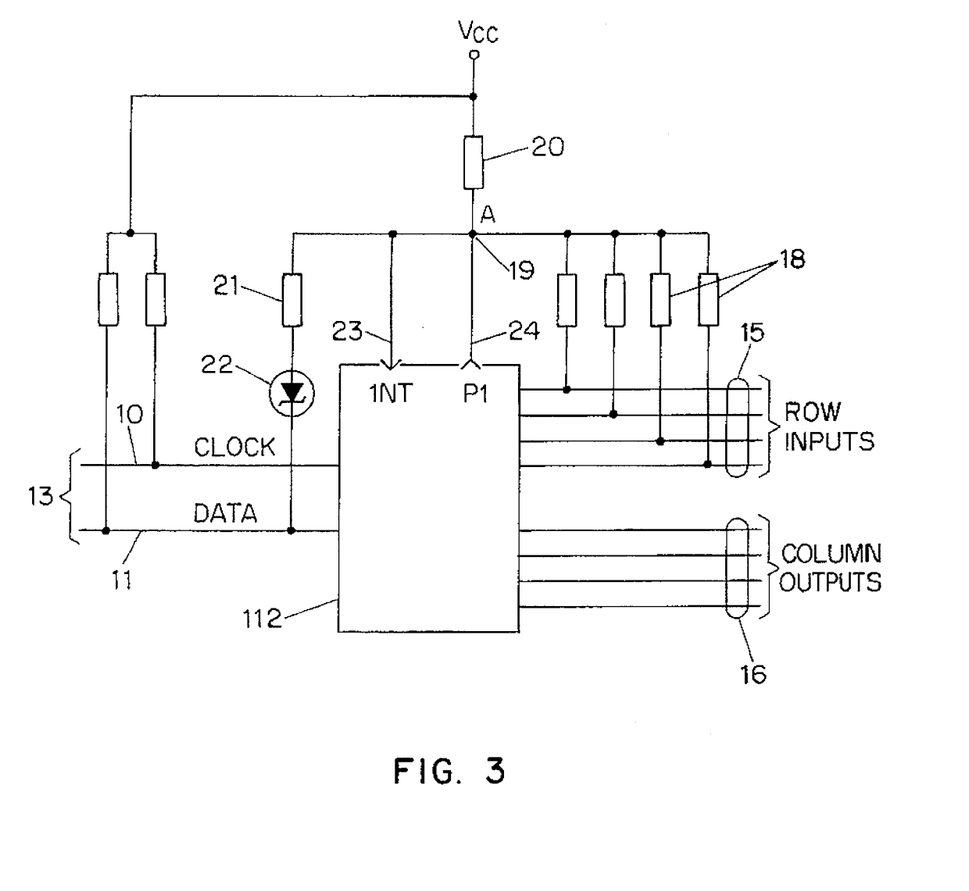
FIG. 3 shows a system corresponding to that of FIG. 2, but with the hardware of the invention.

FIG. 3 shows the hardware aspects of an embodiment of the invention in which hardware has been added to the system of FIG. 2. The encoder 112 is connected to the row inputs 15, and provides column outputs 16 to the key matrix. As will be discussed, in normal operation the resistors 18 act as pullup resistors much as the resistors 17 act in FIG. 2 as in prior art systems. According to the invention, however, point A to which resistors 18 are tied is not (as in FIG. 2) connected permanently to +5V. Instead, point A is forced high by an output 24 of the encoder 112.

Those skilled in the art will appreciate that while the output 24 and input 23 are shown as distinct in FIG. 3, nothing in the invention requires this. The signals could be conveyed over a single pin of the encoder, thus saving a pin.

With output 24 high, the electrical function of FIG. 3 is much like that of FIG. 2. This represents a "normal operation" mode for the keyboard, in which its modest power consumption is at its normal active level.

Now assume it is desired to make the keyboard "green" so that when no activity is called for the processor goes into a mode with substantially less power consumption. One approach is that after the passage of some defined interval of time, such as a few milliseconds, during which nothing has happened (no key activity and no assertion by the computer of the communications bus to the keyboard), the processor desirably and according to the invention prepares to go into a "sleep" mode. More preferably the approach is that after completion of any pending tasks, the processor prepares to go into a "sleep" mode.

Figure 4:
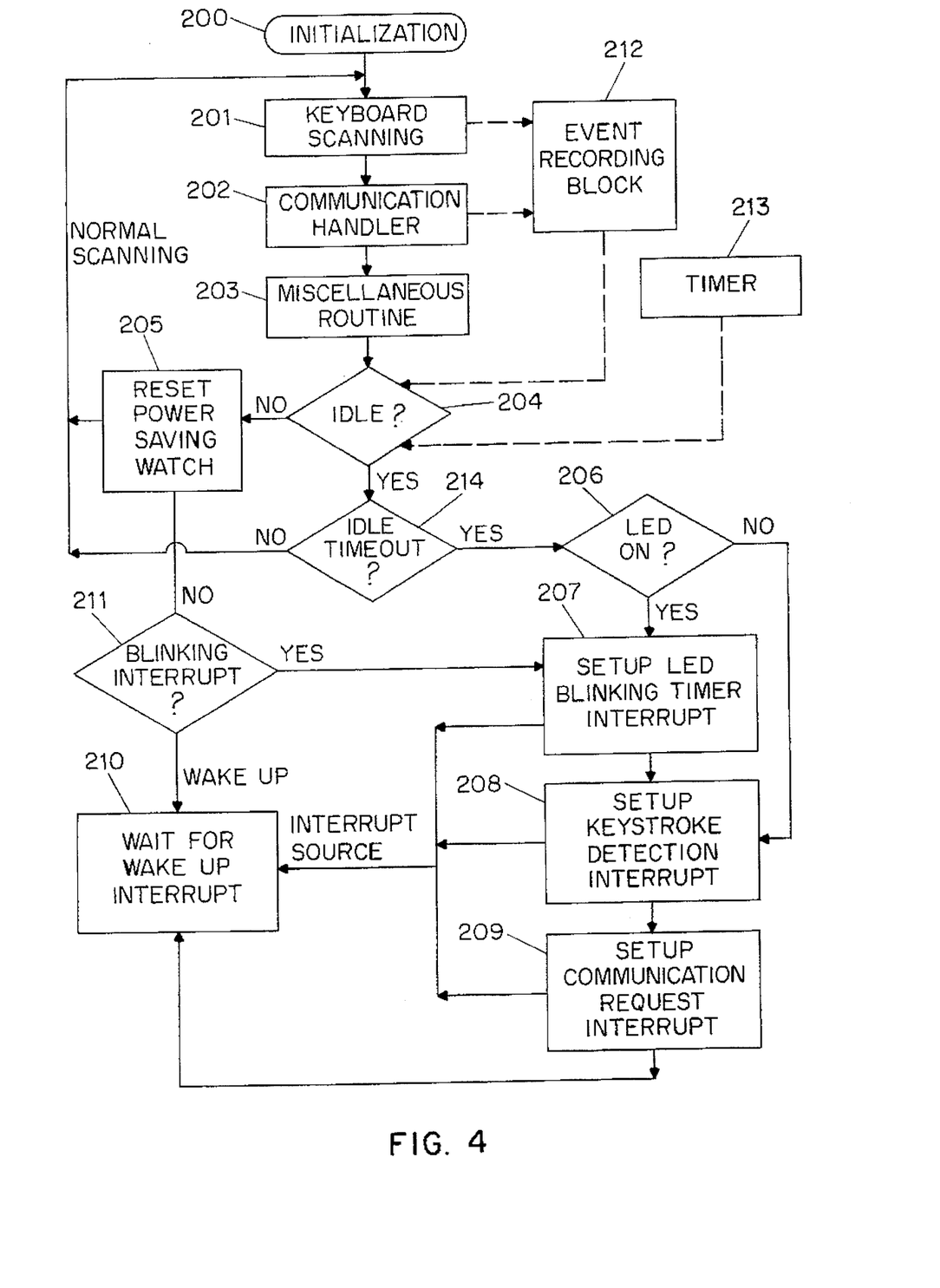
FIG. 4 is a flowchart illustrating the sequence of control in the system according to the invention.

(This is shown in FIG. 4 at block 210, "wait for wake up interrupt".) As part of going into sleep mode, according to the invention the encoder 112 deactivates the output 24.

Deactivation of output 24 permits the point A to float high, biased upwards by pullup resistor 20. Pullup 20 is preferably 150K ohms, while resistors 18 and 21 are preferably one-tenth of that amount or about 15K ohms. When a key is pressed in the key matrix connected to column outputs 16 and row inputs 15, the result is that the point A is pulled down to a voltage level defined by the voltage divider of resistor 20 and resistor 18, in the neighborhood of one-tenth of $V_{CC}$. This counts as an active-low input at the interrupt line 23. The interrupt 23 causes the processor to resume normal-power execution, including handling of the key press that just occurred.

Experience with the dynamics of key presses shows that the latency time of the encoder to respond to the interrupt is short enough that keystrokes are not lost.

Thus, according to the invention, there is provided a way for a key closure to interrupt the processor, with a minimum of components external to the encoder. The small component count is seen when one considers that the pullup resistors 18 would be present with or without the invention. The only added external component described thus far is the resistor 20.

It will be appreciated that in some embodiments the resistor 20 may be omitted. The level of the interrupt signal can be pulled up by the reverse resistance of the diode 22. Stated differently, the pullup impedance can be the diode to its signal line rather than a resistor to a fixed voltage level.

Ordinary design activity, presented with the circuitry just described, would prompt the designer to provide connections between the data line 11 and the point A, and between the clock line 10 and the point A. For example, Schottky diode 22 and resistor 21 could be provided twice, once for the data line 11 and again for the clock line 10. Assertion (pulling low) of either line would then interrupt the encoder 112.

According to the invention, however, only the data line 11 is connected to the point A as shown in FIG. 3 via the diode and resistor. Counter-intuitively, the clock line 10 is not connected to the point A.

The use of a Schottky diode as diode 22 is of interest. The diode blocks the interference between the interrupt pin 21 and the data line 11 in normal mode, and yet it is still able to transfer the interrupt request when the encoder is in sleep mode, all with an exceedingly small parts count.

If the design of the communications channel between the computer and keyboard were asynchronous, for example with all data flow at fixed baud rates and initiated by start bits, then it would be a natural design decision to take the data line as an interrupt, since the arrival of a start bit would represent imminent incoming data. But in systems (such as PS/2 systems) where the communications channel is synchronous, normal design practice is to assume that the state of the data line only conveys meaningful information when the clock line has a transition indicating that the data line has data.

As mentioned above, however, in some computer systems the clock line 10 is used not only as a way of clocking data on the data line, but also as a way of signaling to the keyboard the general unavailability of resources for receiving data from the keyboard. Thus from time to time the clock line may be used not only to provide timing signals for data but also as a way of suppressing data from the keyboard.

According to the invention, then, it will be appreciated that if the data line 11 is to be used as an input to the interrupt point A, then the encoder 112 will have to respond to the interrupt with a quick enough response so as not to lose any incoming data on the data line 11. Experience shows that this is possible given normal processor computational speeds. The encoder can be a UR5HC458FB microcontroller with a 2 MHz computational clock.

It will also be appreciated that the input and output pins can be one and the same pin without departing from the invention in any way. In that case the internal circuitry of the encoder connects the input circuitry and the output circuitry to the same single pin.

It will also be appreciated that all the components linking the keyboard and incoming serial conductors to the wake-up circuitry of the encoder could be placed inside the encoder, without departing in any way from the invention.

It is also desirable to have a keyboard that is capable of being daisy-chained, that is, a keyboard that can be plugged into a computer system, and that can in turn have a second keyboard (e.g. a full-sized conventional keyboard) plugged into it. In such a design, there are clock and data lines that are counterparts to the lines 10 and 11, provided to a jack into which the second keyboard is or may be plugged. There, too, one of the lines is connected via a diode and resistor similar to 21 and 22 to the point A. In this case the clock line is connected via a diode to the same resistor, because the communication session is initiated by the external PS/2 device by asserting clock pulses. In this configuration the list of possible "wake-up" inputs to the encoder is the keyboard, the computer system, and the second keyboard if installed.

It should also be appreciated that the term "second keyboard" in this context really embraces any external device generating inputs and outputs as a keyboard would generate. That includes pointing devices such as mice. Likewise, while the invention is illustrated herein in the context of a computer keyboard with a multiplicity of keys, it should be appreciated that the invention offers its energy-saving benefits in the encoder for any input device that follows the particular serial protocol addressed herein. For example, while the invention is illustrated with respect to a keyboard encoder responding to keys in a key matrix, the invention offers its benefits if the input device is not a keyboard but is instead a mouse, a trackball, a digitizer, or a writing tablet, to give examples. In the case of the mouse and trackball the encoder responds not to keys on a keyboard but to movement in two dimensions of the mouse or the trackball, and also to the clicking of buttons. In the case of the digitizer, the encoder responds not to keys on a keyboard but to absolute position in two dimensions of the digitizer, and also to the clicking of buttons. In the case of the writing tablet, the encoder responds not to keys on a keyboard but to contact with the tablet at positions defined in two dimensions.

FIG. 4 is a flowchart illustrating the sequence of control in the system according to the invention. In FIG. 4 at block 200 the encoder is initialized, for example upon power-up. Keyboard scanning takes place in block 201, as in the prior art. Communications in each of two directions between computer system and keyboard are handled in block 202. Point 204 is reached from time to time, in which case if the encoder is idle then a record is made. At block 214 a test is made if the idle condition has persisted for a preset time interval. If the answer is in the affirmative, then a control proceeds (skipping the LED control blocks for the moment) to blocks 208 and 209, where the conditions are set into place to permit detecting a keystroke interrupt or a communications interrupt. For example, as mentioned above, output port 24 is de-asserted, permitting point A to be biased upwards by resistor 20. Likewise all the column outputs 16 are pulled to ground.

Then the encoder waits for something to happen, in block 210 in a very low-power mode. If something happens then control passes from block 210 back to the main task look including blocks 201. This may happen due to a keystroke or due to activity on the data line 11 of the synchronous channel.

Figure 5:
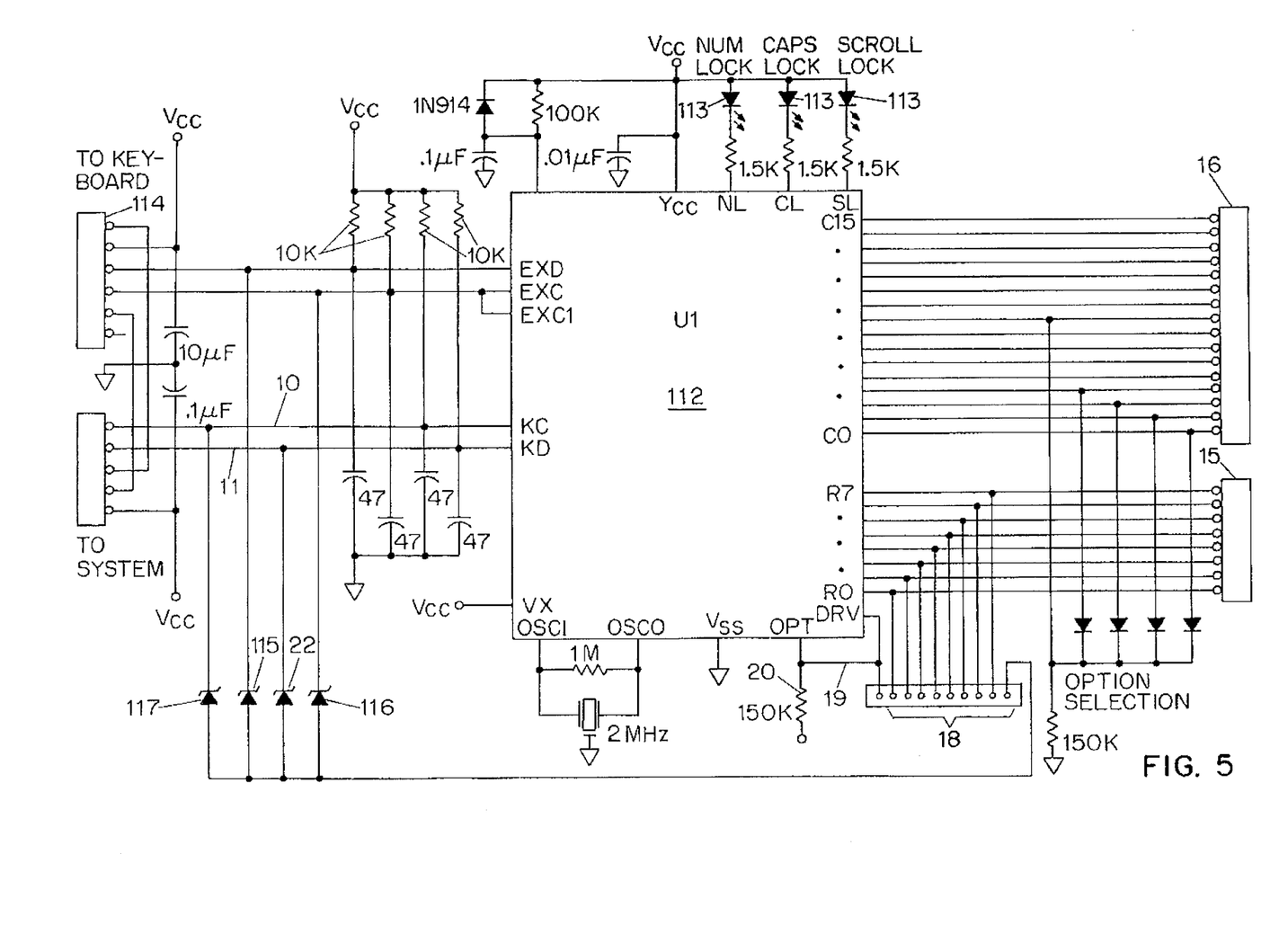
FIG. 5 shows another embodiment of the invention in schematic detail.

The LEDs, as will be appreciated by those skilled in the art, annunciate shift lock, nums lock, and scroll lock. (The designer is tempted, of course, to omit the scroll lock LED since no application in the history of the IBM PC has ever used that key and LED.) The LEDs generally draw more power than the entire rest of the keyboard, including the encoder 12 or 112. Such LEDs are shown, for example, at 113 in FIG. 5. FIG. 5 also shows a full range of column lines C0 through C16, and a full range of row lines R0 through R7, permitting as many as 136 matrix cross-points where keys could be located. A second keyboard can be connected at communications channel 114, which is substantially a counterpart to the channel of lines 10 and 11. Diodes 115, 117 are used for the XT protocol and are not necessary for the PS/2 protocol. For the PS/2 protocol, preferably diode 117 is omitted to eliminate spurious interrupts to the encoder 112 due to the computer system's occasional assertion of the clock line simply to inhibit data sending by the keyboard.

Returning now to the discussion of the LEDs 113, and with reference to FIG. 4, according to the invention when one or more LEDs is turned on by the computer system, then the encoder desirably enters into a stand-by mode in which it wakes up periodically to send another pulse to the LEDs. The frequency and duration of the pulses is decreased with the passage of time if there is no activity on the key matrix, so that gradually the LEDs fade out. Desirably the LEDs are turned on and off at a rate faster than the human eye can detect, so that the only perceived change is just a slight dimming of the LEDs. This method optimizes power consumption of the whole keyboard subsystem since the LEDs consume more power than the encoder itself.

Those skilled in the art can readily devise obvious variations and modifications of the invention which differ in merely obvious ways from what has been described, but that in no way deviate from the invention, as defined by the claims that follow.

What is claimed is:

1. An energy-saving keyboard for use with a computer of the type having a keyboard interface with a clock line and a data line, the computer disposed to transmit data to the keyboard by asserting the clock line and thereafter communicating the data by changes in the state of the data line while changes in the state of the clock line are provided by the keyboard, the keyboard comprising:

an encoder communicatively coupled with the keyboard interface, the encoder having a normal-power mode and a low-power mode, the encoder having an input switching the encoder from the low-power mode to the normal mode;

a matrix of keys connected with the encoder; and circuit means operatively coupling the data line and not the clock line to the input of the encoder.

2. The keyboard of claim 1 wherein the encoder further comprises a discrete output, and wherein the matrix of keys defines rows and columns, each row and each column connected with a respective pin of the encoder;

the keyboard further comprising an array of resistors, one end of each resistor connected with a common point and the other end of each resistor connected with a respective one of the rows; and a pullup impedance connecting the common point with a predetermined voltage;

said common point connected with the input of the encoder and connected with the discrete output of the encoder.

3. The keyboard of claim 2 wherein the discrete output of the encoder and the input to the encoder comprise a single connection point.

4. The keyboard of claim 2 wherein the discrete output of the encoder and the input to the encoder comprise separate connection points.

5. The keyboard of claim 2 wherein the pullup impedance is within the encoder, and wherein the circuit means comprises a conductor and electrical components, the components being within the encoder.

6. The keyboard of claim 2 wherein the resistors of the array are of substantially identical resistance and wherein the pullup impedance is a resistor with a resistance more than five times that of the resistors of the array.

7. The keyboard of claim 2 wherein the encoder is powered at a level relative to ground and the predetermined voltage is the power level.

8. The keyboard of claim 2 wherein the encoder further comprises software means responsive to receipt of the input for asserting the discrete output.

9. The keyboard of claim 2 wherein the encoder further comprises software means responsive to receipt of the input for asserting the discrete output, whereby the common point is held at a substantially fixed voltage despite any key closures at the keys.

10. The keyboard of claim 1 wherein the circuit means comprises a diode in series with a resistor.

11. The keyboard of claim 1 wherein the diode is a Schottky diode.

12. The keyboard of claim 1 wherein the circuit means comprises a conductor and electrical components, the components placed within the encoder.

13. An energy-saving keyboard for use with a computer, the keyboard comprising:

an encoder operatively coupled with the computer, the encoder having a normal-power mode and a low-power mode, the encoder having an input switching the encoder from the low-power mode to the normal mode, said encoder having a discrete output;

a matrix of keys, said matrix defining rows and columns, each row and each column connected with a respective pin of the encoder;

an array of resistors, one end of each resistor connected with a common point and the other end of each resistor connected with a respective one of the rows; and a pullup impedance connecting the common point with a predetermined voltage;

said common point connected with the input of the encoder and connected with the discrete output of the encoder.

14. The keyboard of claim 13 wherein the computer is of the type having a keyboard interface with a clock line and a data line, the computer disposed to transmit data to the keyboard by asserting the clock line and thereafter communicating the data by changes in the state of the data line with changes in the state of the clock line provided by the keyboard, the keyboard further comprising circuit means operatively coupling the data line and not the clock line to the input of the encoder.

15. The keyboard of claim 14 wherein the circuit means is a diode in series with a resistor.

16. The keyboard of claim 16 wherein the diode is a Schottky diode.

17. The keyboard of claim 13 wherein the discrete output of the encoder and the input to the encoder comprise a single connection point.

18. The keyboard of claim 13 wherein the discrete output of the encoder and the input to the encoder comprise separate connection points.

19. The keyboard of claim 13 wherein the pullup impedance is within the encoder.

20. The keyboard of claim 13 wherein the resistors of the array are of substantially identical resistance and wherein the pullup impedance is a resistor with a resistance more than five times that of the resistors of the array.

21. The keyboard of claim 13 wherein the encoder is powered at a level relative to ground and the predetermined voltage is the power level.

22. The keyboard of claim 13 wherein the encoder further comprises software means responsive to receipt of the input for asserting the discrete output.

23. The keyboard of claim 13 wherein the encoder further comprises software means responsive to receipt of the input for asserting the discrete output, whereby the common point is held at a substantially fixed voltage despite any key closures at the keys.

24. A method for use in an energy-saving keyboard for use with a computer of the type having a keyboard interface with a clock line and a data line, the computer disposed to transmit data to the keyboard by asserting the clock line and thereafter communicating the data by changes in the state of the data line with changes in the state of the clock line provided by the keyboard, the keyboard comprising an encoder communicatively coupled with the keyboard interface, the encoder having a normal-power mode and a low-power mode, the encoder having at least one input switching the encoder from the low-power mode to the normal mode, a matrix of keys connected with the encoder; and circuit means operatively coupling the data line and not the clock line to the input of the encoder; the method comprising the steps of:

entering the low-power mode in the absence of recent activity at the keys and at the keyboard data line but without regard to whether or not there has been recent activity at the keyboard clock line; and entering the normal-power mode in response to activity at the keyboard data line without regard to whether or not there is activity at the keyboard clock line.

25. The method of claim 24 wherein the encoder further comprises a discrete output, and wherein the matrix of keys defines rows and columns, each row and each column connected with a respective pin of the encoder, the keyboard further comprising:

an array of resistors, one end of each resistor connected with a common point and the other end of each resistor connected with a respective one of the rows, and a pullup impedance connecting the common point with a predetermined voltage, said common point connected with the input of the encoder and connected with the discrete output of the encoder, wherein the step of entering the normal-power mode further comprises the step of asserting the discrete output.

26. The method of claim 25 wherein the discrete output of the encoder and the input to the encoder comprise a single connection point.

27. The method of claim 25 wherein the discrete output of the encoder and the input to the encoder comprise separate connection points.

28. The method of claim 25 further comprising the step, after entering the normal-power mode, of determining whether the input causing entry into the normal-power mode was the keyboard data line or the key matrix.

29. An energy-saving keyboard for use with a computer, the keyboard comprising a matrix of keys and an encoder responsive to closures on the matrix for sending scancode data to the computer via a communications channel, the keyboard further comprising at least two light-emitting diodes, the microcontroller responsive to messages received via the communications channel for turning the light-emitting diodes on and off, further comprising:

means responsive to a light-emitting diode being on, and further responsive to passage of a predetermined interval of time in the absence of closures on the matrix, for dimming the light-emitting diode.

30. The keyboard of claim 29 wherein the dimming further comprises cycling the light-emitting diode on and off through a duty cycle of gradually lessening "on" times relative to the "off" times.

31. An energy-saving input device for use with a computer of the type having a keyboard interface with a clock line and a data line, the computer disposed to transmit data to the input device by asserting the clock line and thereafter communicating the data by changes in the state of the data line while changes in the state of the clock line are provided by the input device, the input device comprising:

an encoder communicatively coupled with the keyboard interface, the encoder having a normal-power mode and a low-power mode, the encoder having an input switching the encoder from the low-power mode to the normal mode;

a user input connected with the encoder; and circuit means operatively coupling the data line and not the clock line to the input of the encoder.

32. The input device of claim 31 wherein the circuit means comprises a diode in series with a resistor.

33. The input device of claim 32 wherein the diode is a Schottky diode.

34. The input device of claim 31 wherein the input device comprises a mouse and the user input comprises a sensor of movement in two dimensions.

35. The input device of claim 31 wherein the input device comprises a trackball and the user input comprises a sensor of movement in two dimensions.

36. The input device of claim 31 wherein the input device comprises a digitizer and the user input comprises a sensor of absolute position in two dimensions.

37. The input device of claim 31 wherein the input device comprises a writing tablet and the user input comprises a sensor of contact with the tablet at positions defined in two dimensions.

38. The input device of claim 31 wherein the circuit means comprises a conductor and electrical components, the components placed within the encoder.

39. A method for use in an energy-saving input device for use with a computer of the type having a keyboard interface with a clock line and a data line, the computer disposed to transmit data to the input device by asserting the clock line and thereafter communicating the data by changes in the state of the data line with changes in the state of the clock line provided by the input device, the input device comprising an encoder communicatively coupled with the keyboard interface, the encoder having a normal-power mode and a low-power mode, the encoder having at least one input switching the encoder from the low-power mode to the normal mode, a user input connected with the encoder; and circuit means operatively coupling the data line and not the clock line to the input of the encoder; the method comprising the steps of:

entering the low-power mode in the absence of recent activity at the user input and at the keyboard data line but without regard to whether or not there has been recent activity at the keyboard clock line; and entering the normal-power mode in response to activity at the keyboard data line without regard to whether or not there is activity at the keyboard clock line.

\* \* \* \* \*